(12) United States Patent
Rana et al.

(10) Patent No.: US 12,094,542 B2
(45) Date of Patent: Sep. 17, 2024

(54) DEVICE AND METHOD TO GENERATE BIAS VOLTAGES IN NON-VOLATILE MEMORY

(71) Applicant: STMicroelectronics International N.V., Geneva (CH)

(72) Inventors: Vikas Rana, Noida (IN); Neha Dalal, Paschim Vihar (IN)

(73) Assignee: STMicroelectronics International N.V., Geneva (CH)

(*) Notice: Subject to any disclaimer, the term of this patent is extended or adjusted under 35 U.S.C. 154(b) by 194 days.

(21) Appl. No.: 17/542,323

(22) Filed: Dec. 3, 2021

(65) Prior Publication Data

US 2022/0180944 A1 Jun. 9, 2022

Related U.S. Application Data

(60) Provisional application No. 63/122,835, filed on Dec. 8, 2020.

(51) Int. Cl.
| | |
|---|---|
| *G11C 16/26* | (2006.01) |
| *G11C 16/04* | (2006.01) |
| *G11C 16/08* | (2006.01) |
| *G11C 16/30* | (2006.01) |
| *G11C 16/32* | (2006.01) |

(52) U.S. Cl.
CPC .......... *G11C 16/26* (2013.01); *G11C 16/0408* (2013.01); *G11C 16/08* (2013.01); *G11C 16/30* (2013.01); *G11C 16/32* (2013.01)

(58) Field of Classification Search
CPC ..... G11C 16/26; G11C 16/0408; G11C 16/08; G11C 16/30; G11C 16/32; G11C 5/145; G11C 7/227; G11C 16/0425; G11C 16/24; G11C 7/04; G11C 16/3445; G11C 16/3459
See application file for complete search history.

(56) References Cited

U.S. PATENT DOCUMENTS

| | | | |
|---|---|---|---|
| 6,281,665 B1 * | 8/2001 | Miyaba .................. | G11C 5/147 |
| | | | 323/224 |
| 6,747,892 B2 | 6/2004 | Khalid | |
| 6,829,171 B2 | 12/2004 | Ooishi | |
| 6,903,599 B2 * | 6/2005 | Chen ...................... | H02M 3/073 |
| | | | 363/60 |
| 7,602,255 B1 * | 10/2009 | Lai ......................... | H03L 7/0895 |
| | | | 331/34 |
| 8,228,709 B2 | 7/2012 | Choi | |
| 8,295,092 B2 | 10/2012 | Kim et al. | |

(Continued)

OTHER PUBLICATIONS

Amrutur et al., "A Replica Technique for Wordline and Sense Control in Low-Power SRAM's," *IEEE Journal of Solid-State Circuits* 33(8):1208-1219, 1998.

*Primary Examiner* — Khamdan N. Alrobaie
(74) *Attorney, Agent, or Firm* — Seed IP Law Group LLP

(57) ABSTRACT

The present disclosure is directed to an integrated circuit that includes a non-volatile memory (NVM). The integrated circuit includes a bias generator that produces stable wordline and bitline voltages for a reliable read operation of the NVM. This disclosure is directed to low voltage memory operations of memory read, erase verify, and program verify. The present disclosure is directed to non-volatile memory circuits that can also operate at low supply voltages in digital voltage supply range.

19 Claims, 7 Drawing Sheets

(56) References Cited

U.S. PATENT DOCUMENTS

| | | | |
|---|---|---|---|
| 8,363,466 B2 | 1/2013 | Shinozaki et al. | |
| 8,654,589 B2* | 2/2014 | Yu | G11C 5/145 |
| | | | 365/189.11 |
| 9,087,578 B2 | 7/2015 | Vimercati et al. | |
| 9,627,011 B1 | 4/2017 | Conte et al. | |
| 9,754,640 B1 | 9/2017 | Yang | |
| 2003/0214332 A1* | 11/2003 | Chen | H03L 7/0891 |
| | | | 327/156 |
| 2004/0062127 A1* | 4/2004 | Li | H02M 3/073 |
| | | | 327/536 |
| 2006/0072363 A1 | 4/2006 | Tran et al. | |
| 2008/0170455 A1* | 7/2008 | Bedarida | G11C 16/26 |
| | | | 365/210.11 |
| 2011/0156805 A1* | 6/2011 | Kwon | H02M 3/07 |
| | | | 327/536 |
| 2011/0255329 A1* | 10/2011 | Kaku | G11C 5/147 |
| | | | 365/189.09 |
| 2012/0300566 A1* | 11/2012 | Mueller | G11C 7/08 |
| | | | 365/203 |
| 2022/0068400 A1* | 3/2022 | Pasotti | G11C 16/26 |
| 2022/0180944 A1* | 6/2022 | Rana | G11C 7/04 |

\* cited by examiner

DEVICE AND METHOD TO GENERATE BIAS VOLTAGES IN NON-VOLATILE MEMORY

BACKGROUND

Technical Field

The present disclosure relates to memory circuits including non-volatile memory arrays.

Description of the Related Art

Non-volatile memory circuits that generate word-line voltages for memory read, erase verify and program verify operations and bit-line voltages to avoid read disturb situations are susceptible to process and temperature variations. Current solutions engaged to handle undesirable variations in word-line and bit-line voltages due to temperature and process changes can be resource intensive and impact performance of the non-volatile memory circuit.

Some of the current solutions require temperature signals from temperature sensors outside the non-volatile memory circuit. Some other solutions monitor the voltages on external pins for any variations due to factors like temperature and process, and using this information to change circuit parameters, until correct voltages are available on the monitored pins. Also, current wordline generation circuits only operate with high analog supply voltage.

BRIEF SUMMARY

The present disclosure is directed to an integrated circuit that includes a non-volatile memory (NVM). The integrated circuit includes a bias generator that produces stable word-line and bitline voltages for a reliable read operation of the NVM. This disclosure is directed to low voltage memory operations of memory read, erase verify, and program verify. The present disclosure is directed to non-volatile memory circuits that can also operate at low supply voltages in digital voltage supply range.

The bias generator includes both a bias replica circuit to generate wordline bias voltages and a cascode voltage generation circuit to generate bitline bias voltages. The bias voltages generated by the bias generator are compensated for any temperature and process variations.

The cascode voltage generation circuit is coupled to a current mirror, which in turn is coupled to a current comparator, an oscillator, a phase generator and a switched capacitor charge pump. The charge pump generates the wordline bias ($V_{GATE}$) for the main memory array and a floating gate voltage (VFG) for a reference memory array in the bias replica circuit.

When a memory read operation begins, VFG may be zero, a supply voltage (VDD) may be settled, the oscillator is enabled and is propagating the clock. The wordline bias, $V_{GATE}$ starts approaching the supply voltage (VDD), the floating gate voltage (VFG) starts increasing, and a current starts building up in the bias replica circuit. The current is mirrored and compared with a reference current ($I_{REF}$), which is the same reference current as the reference current of a sense amplifier in the main memory array. If the mirrored current is less than the reference current $I_{REF}$, the oscillator propagates the clock. An inverter and an AND gate may be coupled to the oscillator and may indicate to the charge pump to keep increasing the wordline bias ($V_{GATE}$) and the floating gate (VFG) until the mirrored current is equal to the reference current, $I_{REF}$.

The bias replica circuit is coupled to the main memory array for which the bias voltages are being generated. The bias replica circuit has all the elements of the main memory array in smaller proportions to mimic or replicate the features and behavior of the main memory array. The bias replica circuit includes a column decoding block, a replica memory array, and a source line path block.

The cascode voltage generation circuit is coupled to a plurality of sense amplifiers of the main memory array. In one embodiment, the cascode voltage generation circuit includes an operational amplifier and an n-mos transistor, where a source of the n-mos transistor is coupled to the operational amplifier in a feedback arrangement, such that a voltage output (Vcasc) of the operational amplifier changes to maintain a stable voltage at the source of the n-mos transistor.

DETAILED DESCRIPTION

Figure 1:
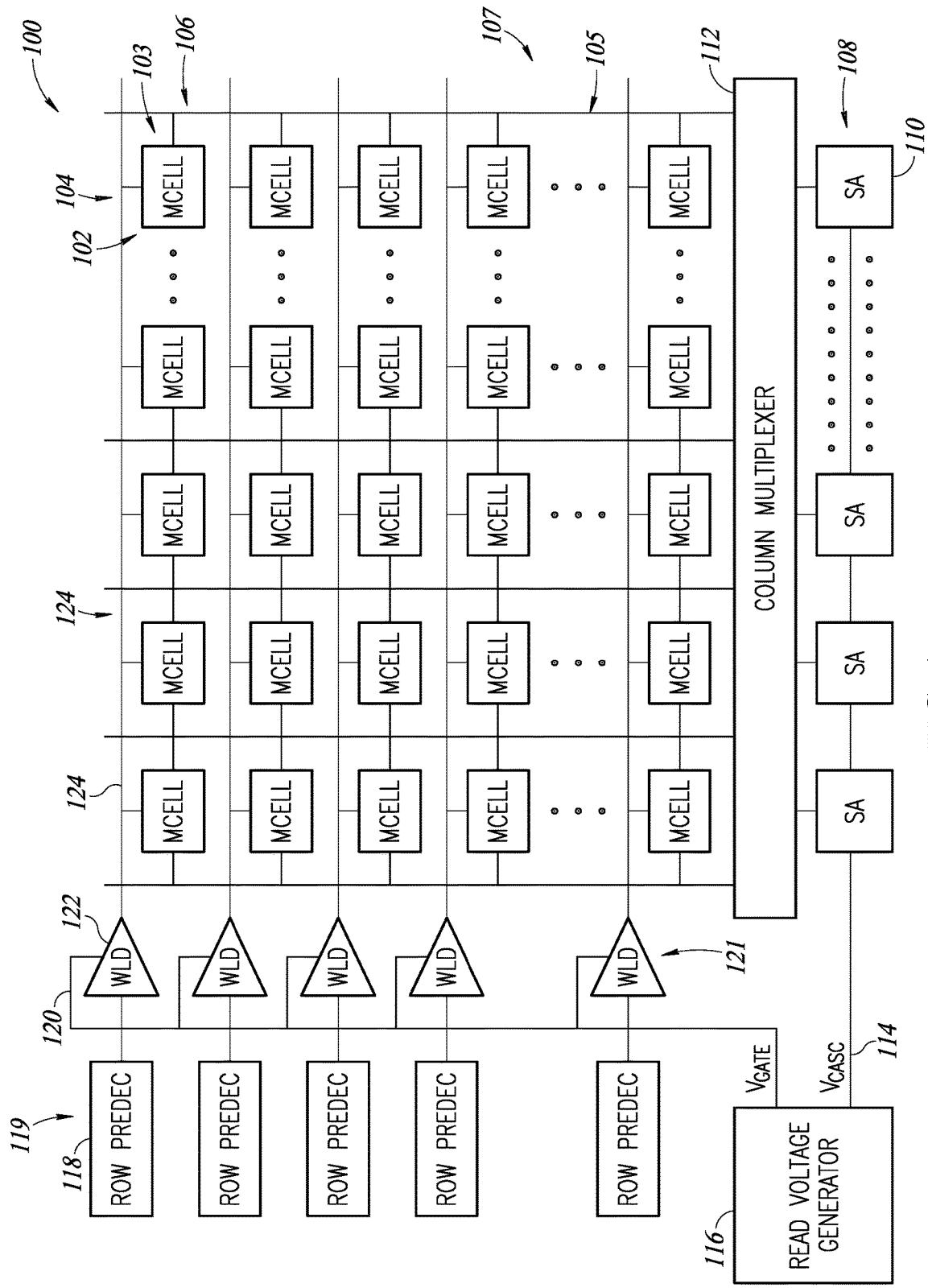
FIG. 1 is a non-volatile memory system including a memory array having memory cells and circuitry to generate memory read voltages including wordline and bitline voltages.

FIG. 1 is an embodiment of a circuit 100 of a non-volatile memory system according to the present disclosure that accommodates process and temperature variations that may arise during use. The circuit shows how wordline and bitline voltages are generated and used by the memory cells of a memory array to perform memory read, program verify, and erase verify operations in the non-volatile memory. The memory read operation of this circuit is described in detail below.

FIG. 1 is an embodiment of a circuit 100 of a non-volatile memory system including a non-volatile memory array 106 having a plurality of memory cells 102 coupled in series to form a plurality of rows 103 of memory cells 102. The non-volatile memory cell 102 is read using wordline voltages and bitline voltages which are applied respectively on a wordline 124 of a plurality of wordlines 104 and a bitline 105 of a plurality of bitlines 107. The plurality of bitlines 107 are coupled to a column multiplexer 112. The column multiplexer 112 is coupled to a plurality of sense amplifiers 108. Each bitline 105 is coupled to a corresponding sense amplifier 110. A read voltage generator 116 generates a gate voltage, $V_{GATE}$ 120 and a cascode voltage Vcasc 114. The gate voltage 120 is coupled to a plurality of wordline drivers 121. A wordline driver 122 of the plurality of wordline drivers 121 is coupled to the read voltage generator 116 through gate voltage $V_{GATE}$ 120. The plurality of sense amplifiers 108 are coupled to the read voltage generator 116 through cascode voltage Vcasc 114. A row pre-decoder 118 of a plurality of row pre-decoders 119 is coupled to the wordline driver 122 of the plurality of wordline drivers 121.

In operation, when the memory cell 102 is selected for reading, a wordline voltage is applied on a gate of the memory cell 102 and a current is discharged on the bitline 105, which is sensed by the sense amplifier 110. The sense amplifier 110 is activated by the cascode voltage Vcasc 114. The wordline voltage is obtained by enhancing the gate voltage 120 through the wordline driver 122.

Figure 2A:
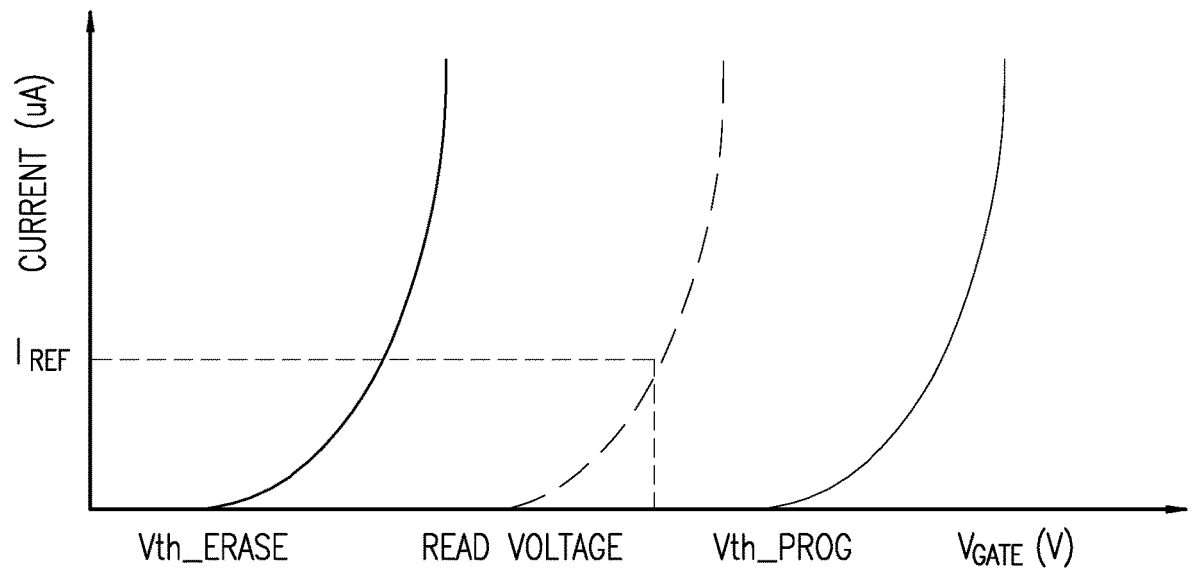
FIG. 2A is a graph of current to gate voltages for memory read, erase verify and program verify.

FIG. 2A is a graph of current to gate voltages for memory cells 102 in operation for memory read, erase verify, and program verify operations. In the non-volatile memory 100, a threshold voltage is defined as a gate voltage where the memory cell provides a selected reference current $I_{REF}$. The threshold voltage of the memory cells 102 is different for different memory operations like, memory read, erase verify and program verify, see Vth_ERASE and Vth_PROG. The memory row to which the memory cell to be read belongs receives a fixed gate voltage equal to the threshold voltage ($V_{GATE}$) for that operation from the read voltage generator 116.

With ageing and repeated operations, threshold voltages for different operations can begin shifting. Voltages for read operations are between voltages for erase verify and program verify operations, at a voltage margin such that these operations remain error free and the shift in threshold voltages, if any, do not overlap with each other.

Figure 2B:
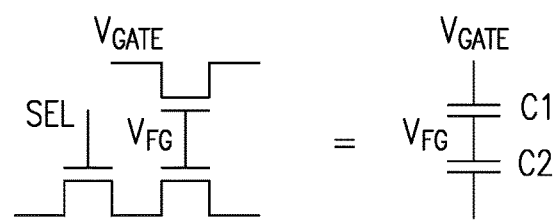
FIG. 2B is a representation of parasitic capacitance associated with gates of transistors.

FIG. 2B is an equivalent circuit representation of a memory cell to be read, which can be represented as two capacitors C1, C2 coupled in series. A floating gate voltage, Vfg is represented by the following equation:

$$Vfg = \frac{C1 \times Vgate}{C1 + C2}.$$

A ratio of memory cell capacitances is given by the following equation:

$$\text{Alpha} = \frac{C1}{C1 + C2}.$$

This ratio is used to determine the Floating Gate Voltage Vfg coupled to the gates of the memory cells of a replica memory array, described in more detail below.

The floating gate voltage can be represented by the following:

$$Vfg = \alpha V_{GATE} \text{ Here } \alpha = \frac{C1}{C1 + C2}.$$

Figure 3:
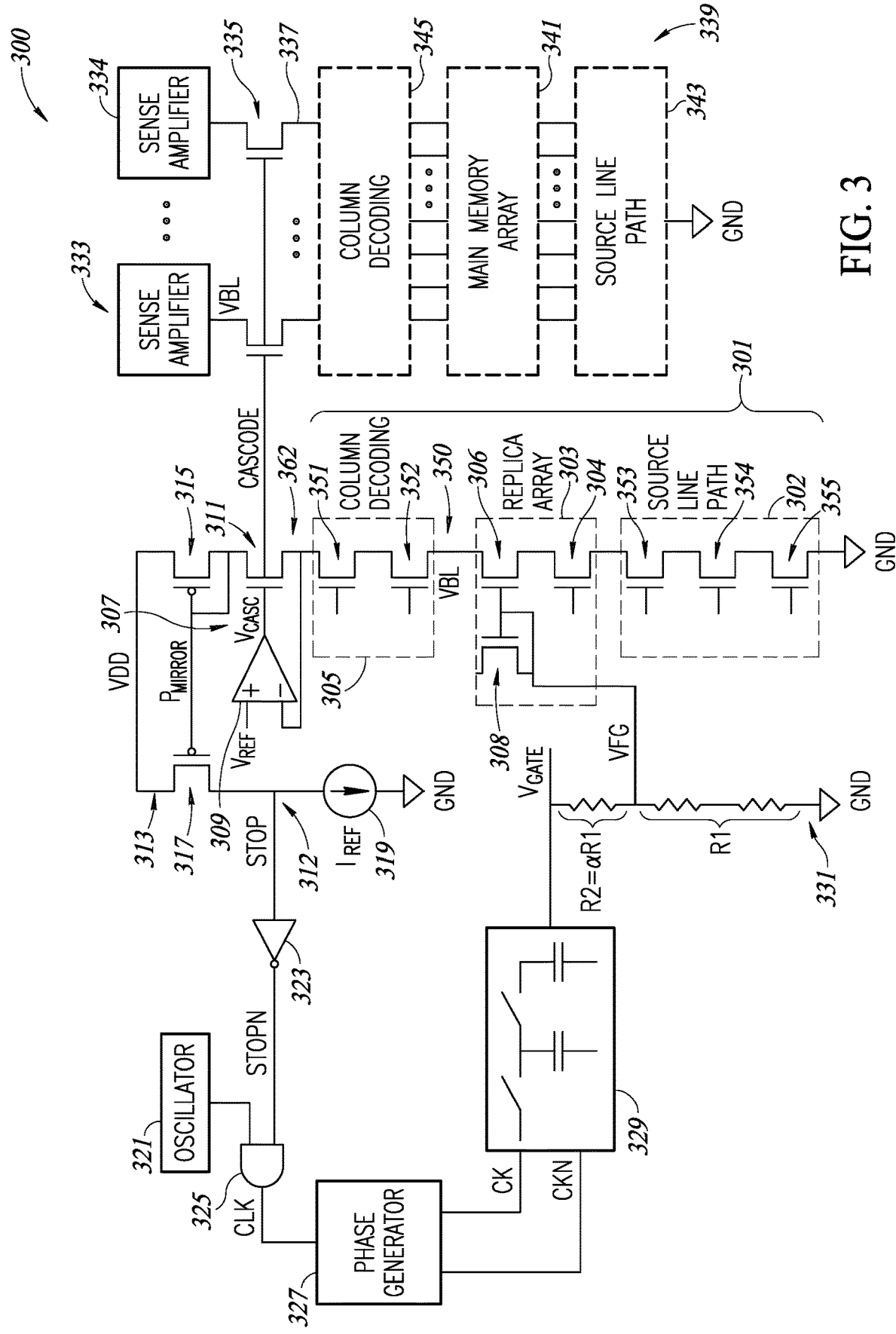
FIG. 3 is an embodiment of a circuit that generates word-line voltages for different read and verify operations and bit-line voltages to avoid read disturb phenomenon in a non-volatile memory.

FIG. 3 is an embodiment of a non-volatile memory (NVM) circuit 300 that generates temperature and process compensated word-line voltages for memory read, erase verify and program verify operations and generates temperature and process compensated bit-line voltages to avoid read disturb in accordance with the present disclosure. This embodiment may be utilized when high supply voltage VDD is not available. An absence of high supply voltage VDD results in the use of a charge pump, to generate the wordline and cascode voltage (Vcasc) higher than the input supply voltage VDD.

The circuit 300 includes a main memory array circuit 339 coupled to a bias replica circuit 301 to generate stable wordline and bitline voltages for a reliable read operation of the NVM. The main memory array circuit 339 includes a main memory array 341 coupled to a source line path block 343 that is coupled to ground. The main memory array 341 is coupled to a column decoding block 345 that is coupled to a plurality of sense amplifiers 333. A plurality of cascode transistors 335 is between the plurality of sense amplifiers 333 and the column decoding block 345 in the FIG. 3. In some embodiments, the cascode transistors 335 are within the sense amplifiers 333.

The bias replica circuit 301 includes a replica source line path block 302 coupled to ground and a replica memory array block 303, which in turn is coupled to a replica column decoding block 305. The bias replica circuit 301 is a representation of the main memory array circuit 339 components, including the column decoding block 345, the main memory array 341, and the source line path block 343. This bias replica circuit 301 is formed at the same time during chip manufacturing as the main memory array circuit 339 such that the components of the bias replica circuit will have the same or similar physical features and will have very similar performance to the main memory array. This allows the bias replica circuit 301 to minimize voltage fluctuations caused by different temperature and process variations during use.

The bias replica circuit is coupled to a cascode voltage generation circuit 307 that is coupled to the main memory array circuit 339 through the cascode transistors 335. The cascode voltage generation circuit 307 includes an operational amplifier 309 coupled to a transistor 311 in a feedback arrangement. An output of the operational amplifier 309 is coupled to gate of the transistor 311. A source terminal of the transistor 311 is coupled to a negative input of the operational amplifier 309. A positive terminal of the operational amplifier 309 is coupled to a voltage supply, the reference voltage, Vref. In some embodiments, the transistor 311 may be an N-MOS transistor.

The cascode voltage generation circuit 307 is coupled to a current mirror 313 having two transistors 315 and 317, which may be P-MOS transistors. The transistors 315, 317 have their gates shorted and coupled to a terminal of the transistor 315 which in turn is coupled to the terminal of the transistor 311 of the cascode voltage generation circuit 307. A terminal of the current mirror transistor 317 of the current mirror 313 is coupled to a current source 319, which produces a reference current $I_{REF}$ which is the same as the reference current applied to every sense amplifier 334 of the plurality of sense amplifiers 333. The terminal of the current mirror transistor 317 is also coupled to an inverter 323. An output of the inverter 323 is coupled to one of the inputs of an AND gate 325. Another input of the AND gate 325 is coupled to an oscillator 321.

An output of the AND gate 325 is a clock, which triggers a phase generator 327 to produce a plurality of clock phases (CK and CKN) at its output. In the illustrated embodiment, the phase generator 327 produces two clock phases. However, the phase generator can produce 4 clock phases. The clock phases are in multiples of two.

The phase generator 327 is coupled to a switched capacitor charge-pump (CP) 329. The two clock phases at the output of the phase generator 327 are the inputs of the charge-pump 329. The charge-pump 329 produces an output voltage $V_{GATE}$, which controls the gates of a plurality of transistors in the main memory array block 341 to generate wordline voltages. The charge-pump 329 is coupled to a resistor ladder 331, which generates a floating gate voltage, VFG.

Different $V_{GATE}$ voltages are used for memory read, program verify or erase verify operations, which are obtained from the resistor ladder 331 by varying resistance of resistors R1 and R2. The floating gate voltage VFG is a function of the gate voltage, $V_{GATE}$ which is given by:

$$VFG = \text{alpha} \times V_{GATE},$$

where $$\text{alpha} = \frac{C1}{C1 + C2},$$

C1 and C2 are capacitances of the transistors 308 and 306 respectively.

The floating gate voltage, VFG controls floating gates of a plurality of few times programmable (FTP) memory cells in the replica memory array block 303. For illustration purposes, one of the FTP memory cell is shown in block 303, which includes three transistors 304, 306, 308 with gates of transistor 306 and transistor 308 shorted and coupled to the floating gate voltage, VFG. A gate of the third transistor 304 is coupled to a supply voltage, VDD. A terminal of transistor 304 is coupled to the source line path block 302. A terminal of the transistor 306 is coupled to the column decoding block 305. A terminal of the transistor 308 could either be floating or shorted with a terminal of the transistor 308. This FTP memory cell arrangement is repeated with a number of FTP memory cells as beneficial for the overall circuit design.

The source line path block 302 includes a plurality of transistors. The number of transistors in the source line path block 302 is directly proportional to a size of the source line path 343. In the illustrated embodiment, three transistors 353, 354 and 355 are connected in series, gates of which are coupled to the supply voltage, VDD. A terminal of the transistor 353 is coupled to the replica array block 303. A terminal of the transistor 355 is coupled to ground.

The column decoding block 305 includes plurality of transistors. The number of transistors in the column decoding block 305 is directly proportional to size of the column decoding block 345. In the illustrated embodiment, two transistors 351 and 352 are connected in series, gates of which are coupled to the supply voltage, VDD. A terminal of the transistor 351 is coupled to a terminal of the cascode transistor 311. A terminal of the transistor 352 is coupled to the replica array.

When the circuit is turned on and power supply VDD is settled or otherwise not fluctuating, the floating gate voltage VFG is zero and the oscillator 321 is enabled. The clock at the output of the oscillator 321 starts to propagate, $V_{GATE}$ starts approaching VDD and VFG starts increasing. A current starts building up in the bias replica circuit 301, which is mirrored by the current mirror 313 and compared with the reference current ($I_{REF}$) used in the current source 319. The current source and the transistor 317 together form a current comparator. If the mirrored current is more than the $I_{REF}$, a stop signal is triggered (logic high) at a node 312 formed by shorting the terminal of the current mirror transistor 317, current source 319 and input of the inverter 323. The stop signal results in a logic low signal at the output of the inverter 323, which stops the clock at the output of the AND gate 325.

The $V_{GATE}$ and VFG voltages at output of the charge pump 329 retain their values in response to the stopped clock at the output of the AND gate 325. At this point, current in the bias replica circuit 301 starts to fall such that $I_{REF}$ current is more than the current in the bias replica circuit 301. This generates a stop signal (logic low) at the input of the inverter 323 leading to a logic high signal at output of the inverter 323, which starts the clock at the output of the AND gate 325. With this, $V_{GATE}$ and VFG voltages at output of the CP 329 start increasing. As a result, current in the bias replica circuit 301 starts to increase again until the $I_{REF}$ current is equal to the current in the bias replica circuit 301. This feedback loop generates a stable voltage for the main memory array.

A transconductance of the cascode transistor 311, the memory cells of the replica memory array 303, and the memory cells of main memory array 341 may change with process and temperature, which may change the current flowing in the bias replica circuit 301 and the main memory circuit 339. This change in current changes bitline voltage VBL at nodes 350 and 362 of the bias replica circuit 301. A change in the bitline voltage VBL at node 362 changes the cascode voltage output of the operational amplifier 309 such that the current flowing in the bias replica circuit changes to maintain the earlier level of bitline voltage, which existed before the process and temperature change impact. Since the cascode voltage output of the operational amplifier 309 is also coupled to the plurality of cascode transistors 335 of plurality of sense amplifiers 333 in the main memory circuit, the bitline voltages in the main memory circuit are protected from process and temperature variations in the same way as the bitline voltages of replica memory array.

As the temperature and process changes vary the current flowing in the main memory array circuit 339, the same current variation is mimicked by the current flowing in the bias replica circuit 301 as the cells of main memory array and replica memory array were formed in the same manufacturing processes and have similar responses to process and temperature variations. By changing voltages $V_{GATE}$ and Vfg, the circuit operation ensures that the current in the bias replica circuit 301 and the main memory array circuit 339 remain stable despite any temperature and process changes.

Figure 4:
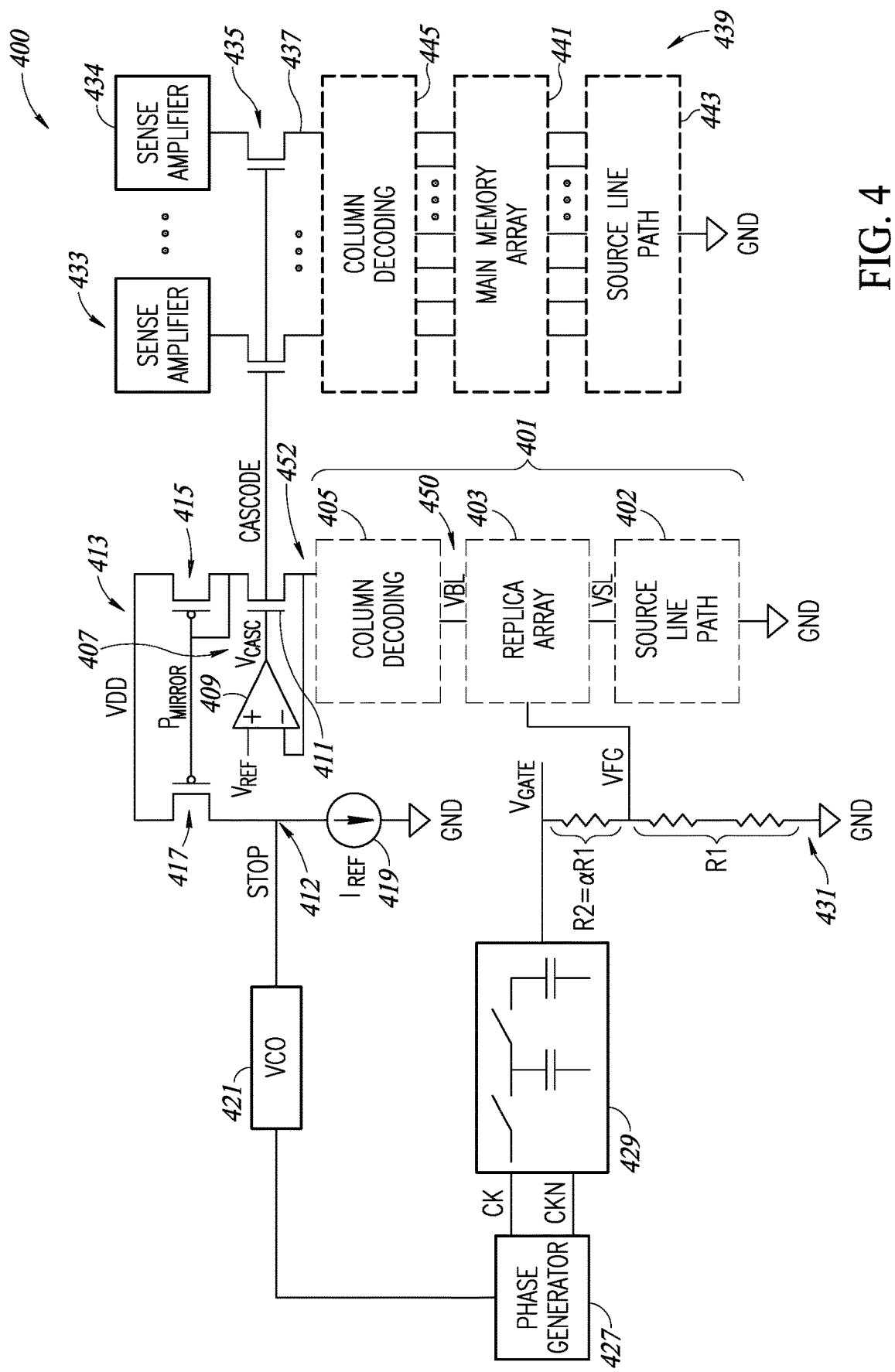
FIG. 4 is another embodiment of a circuit having a voltage controlled oscillator that generates word-line voltages for different read and verify operations, and bit-line voltages to avoid read disturb phenomenon, in a non-volatile memory.

FIG. 4 is an alternative embodiment of a non-volatile memory circuit 400 that generates temperature and process compensated word-line voltages for memory read, erase verify and program verify operations and generates temperature and process compensated bit-line voltages to avoid read disturb in accordance with the present disclosure. This embodiment may be utilized when high supply voltage VDD is not available. An absence of high supply voltage VDD results in the use of a charge pump, to increase the supply voltage VDD to a level higher than the available VDD, to generate wordline and bitline voltages.

The circuit 400 includes a main memory array circuit 439 coupled to a bias replica circuit 401. The main memory array circuit 439 includes a main memory array 441 coupled to a source line path block 443 that is coupled to ground. The main memory array 441 is coupled to a column decoding block 445 that is coupled to a plurality of sense amplifiers 433. A plurality of cascode transistors 435 is between the plurality of sense amplifiers 433 and the column decoding block 445 in the FIG. 4. In some embodiments, the cascode transistors 435 are within the sense amplifiers 433.

The bias replica circuit 401 includes a replica source line path block 402 coupled to ground and a replica memory array block 403, which in turn is coupled to a replica column decoding block 405. The bias replica circuit 401 is a representation of the main memory array circuit 439 components, including the column decoding block 445, the main memory array 441, and the source line path block 443. This bias replica circuit 401 is formed at the same time as the main memory array circuit 439 such that the components of the bias replica circuit will have the same or similar physical features and will have very similar performance to the maim memory array. This allows the bias replica circuit 401 to minimize voltage fluctuations caused by different temperature and process variations during use.

The bias replica circuit is coupled to a cascode voltage generation circuit 407 that is coupled to the main memory array circuit 439 through the cascode transistors 435. The cascode voltage generation circuit 407 includes an operational amplifier 409 coupled to a transistor 411 in a feedback arrangement. An output of the operational amplifier 409 is coupled to a gate of the transistor 411. A terminal of the transistor 411 is coupled to a negative input of the operational amplifier 409. A positive terminal of the operational amplifier 409 is coupled to a voltage supply, which is the reference voltage, Vref. In some embodiments, the transistor 411 may be an N-MOS transistor.

The cascode voltage generation circuit 407 is coupled to a current mirror 413 having two transistors 415 and 417, which may be P-MOS transistors. The transistors 415, 417 have their gates shorted and coupled to a terminal of the transistor 415, which in turn is coupled to another terminal of the transistor 411 of the cascode voltage generation circuit 407.

A terminal of the current mirror transistor 417 of the current mirror 413 is coupled to a current source 419, which uses a reference current $I_{REF}$ which is the same as the reference current applied to every sense amplifier 434 of the plurality of sense amplifiers 433. The terminal of the current mirror transistor 417 is also coupled to a voltage controlled oscillator 421.

An output of the oscillator 421 is a clock, which triggers a phase generator 427 to produce a plurality of clock phases (CK, CKN). The phase generator 427 is coupled to a switched capacitor charge pump (CP) 429. The two clock phases at the output of the phase generator 427 are inputs of the charge pump 429. The charge pump 429 produces an output voltage $V_{GATE}$, which controls the gates of plurality of transistors in the main memory array block 441 to generate the wordline voltages. The charge pump 429 is coupled to a resistor ladder 431, which generates a floating gate voltage, VFG. The VFG controls gates of a plurality of transistors in the replica memory array block 403.

When the circuit is turned on and power supply VDD is settled or otherwise not fluctuating, the floating gate voltage VFG is zero and the oscillator 421 is enabled. The clock at the output of the oscillator 421 starts to propagate, $V_{GATE}$ starts approaching VDD and VFG starts increasing. A current starts building up in the bias replica circuit 401, which is mirrored by the current mirror 413 and compared with a reference current ($I_{REF}$) used by the current source 419. If the mirrored current is more than the $I_{REF}$, a signal is triggered at a node 412 formed by shorting the terminal of the current mirror transistor 417, current source 419 and an input of the VCO 421. This signal results in slowing the clock frequency at the output of oscillator 421. The current source 419 and the transistor 417 form a current comparator.

The $V_{GATE}$ and VFG voltages at the output of the charge pump 429 retain their values in response to the slow clock at the output of the oscillator 421. At this point, current in the bias replica circuit 401 starts to fall such that the $I_{REF}$ is more than the current in the bias replica circuit 401. The signal at the node 412 changes such that the frequency of the clock at the output of the oscillator 421 starts increasing. With this, $V_{GATE}$ and VFG voltages at the output of the charge pump 429 start increasing. As a result, current in the bias replica circuit 401 starts to increase again until the $I_{REF}$ current is equal to the current in the bias replica circuit 401. This feedback loop generates a stable voltage for the main memory array.

A transconductance of cascode transistor 411, the memory cells of the replica memory array 403, and the memory cells of main memory array 441 can change with process and temperature, which may change the current flowing in the bias replica circuit 401 and the main memory circuit 439. This change in current changes the bitline voltage VBL at nodes 450 and 452 of the bias replica circuit 401. A change in the bitline voltage VBL at node 452 changes the cascode voltage output of the operational amplifier 409 such that the current flowing in the bias replica circuit changes to maintain the earlier level of the bitline voltage, which existed before the process and temperature change impact. Since the cascode voltage output of the operational amplifier 409 is also coupled to the plurality of cascode transistors 435 of the plurality of sense amplifiers 433 in the main memory circuit, the bitline voltages in the main memory circuit are protected from process and temperature variations in the same way as the bitline voltages of replica memory array.

As the temperature and process changes vary the current flowing in the main memory array circuit 439, the same current variation is mimicked by the current flowing in the bias replica circuit 401 as the cells of main memory array and replica memory array were formed in the same manufacturing processes and have similar responses to process and temperature variations. By changing the voltages $V_{GATE}$ and Vfg, the circuit operation ensures that the current in the bias replica circuit 401 and the main memory array circuit 439 remain stable despite any temperature and process changes.

Figure 5:
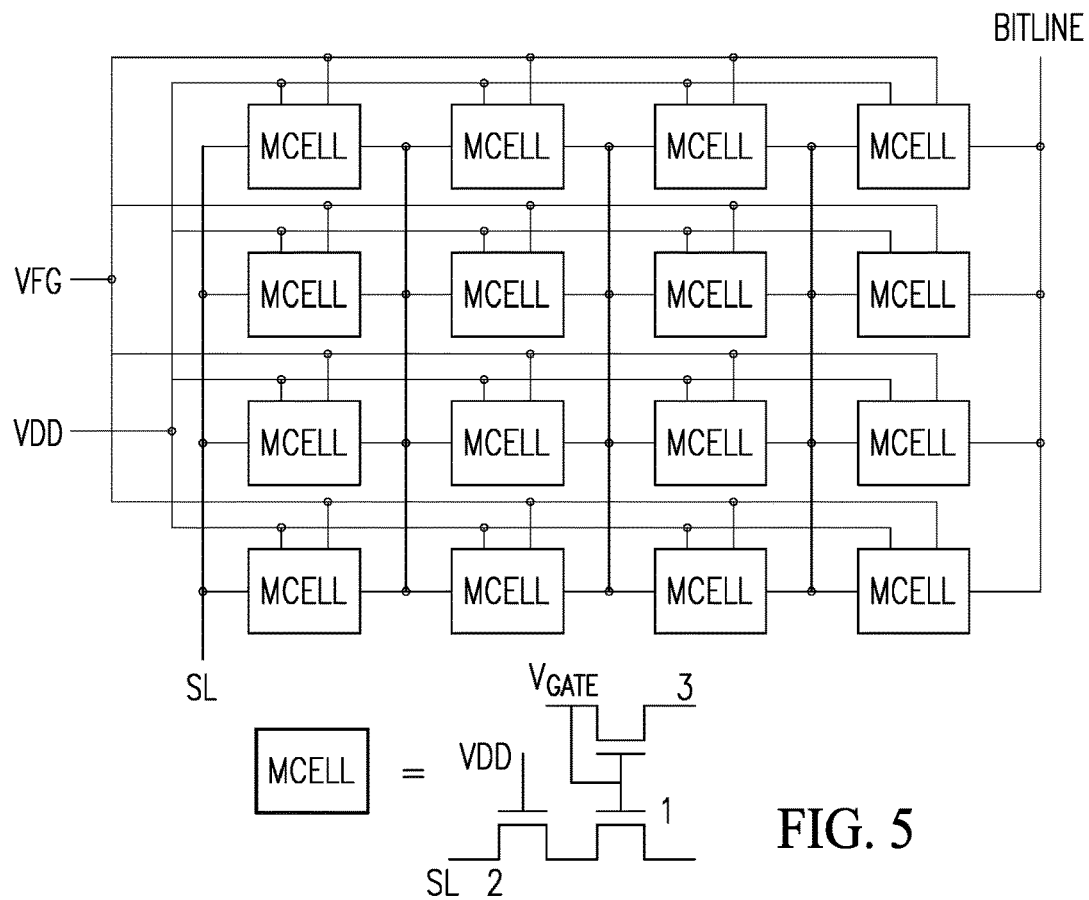
FIG. 5 is an embodiment of a replica memory array having memory cells coupled in series and parallel configuration.

FIG. 5 is an embodiment of a replica memory array of a bias replica circuit which includes memory cells coupled in a series and parallel combination such that a length to width ratio of the memory array is one that determines a mirroring ratio of a current mirror, which is equivalent to a single memory cell. If this ratio is in integral multiple ratios, then the mirror ratio will be adjusted accordingly. In this embodiment, the replica memory array includes sixteen memory cells arranged in a matrix of 4×4 such that they are arranged in four rows and four columns. All of the memory cells in every row of the four rows are coupled in series and all the memory cells in every column of the four columns are coupled in parallel. A source line terminal SL of transistor 2 of the memory cell is shorted and coupled to a source line and a bitline terminal of transistor 1 of every memory cell is shorted and coupled to a bitline. Gates of transistors 1, transistor 3 and a terminal of transistor 3 of all of the memory cells of the replica memory array are shorted and coupled to a floating gate voltage, VFG. A gates of transistor 2 of all of the memory cells of the replica memory array are also shorted and coupled to the supply voltage VDD.

In this example, connecting memory cells in parallel increases a width of memory cells to be equal to 4*W. Similarly connecting the memory cells in series makes the length of memory cells equivalent to 4*L. This makes a width to length ratio (W/L) equivalent to a single memory cell. If a series to parallel ratio is not same, then a current mirror ratio in the bias replica branch may be adjusted.

Figure 6:
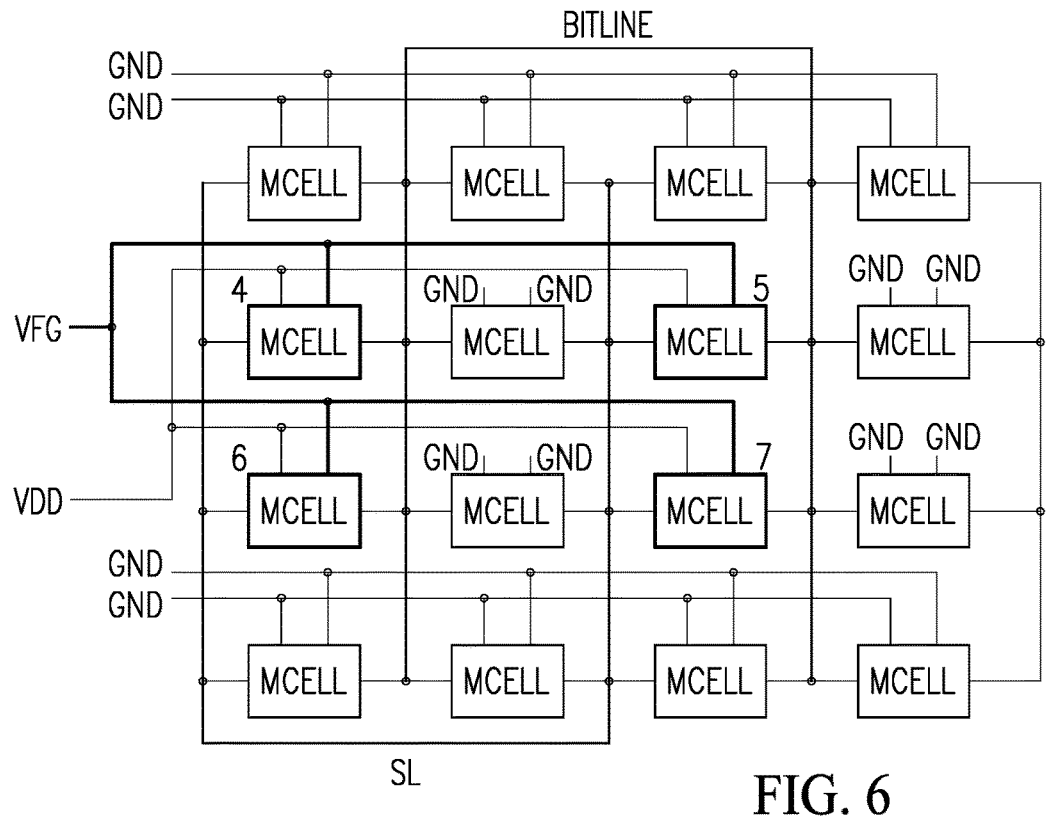
FIG. 6 is an alternative embodiment of a replica memory array with memory cells coupled in a parallel configuration.

FIG. 6 is an embodiment of a replica memory array of a bias replica circuit. In this embodiment, the replica memory array includes sixteen memory cells arranged in a matrix of 4×4 such that they are arranged in four rows and four columns. Four memory cells, 4, 5, 6 and 7 of the replica memory array are joined in parallel and the rest all the 12 memory cells of the replica memory array are coupled to the ground by shorting gates of transistor 1, 2 and 3 of every memory cell and coupling them to the ground. A terminal of transistor 3 is also coupled to the shorted ground of the three transistors 1, 2 and 3. This results in a length to width ratio of 1:4 in the replica memory array which determines mirroring ratio of a current mirror.

A source line terminal SL of transistor 2 of the four memory cells 4, 5, 6 and 7 is shorted and coupled to a source line and the bitline terminal of transistor 1 of the four memory cells 4, 5, 6 and 7 in the replica memory array is shorted and coupled to a bitline. Gates of transistors 1, transistor 3 and source of transistor 3 of all the four memory cells of the replica memory array are shorted and coupled to a floating gate voltage VFG/$V_{GATE}$. Gates of transistor 2 of all the memory cells of the replica memory array are also shorted and coupled to the supply voltage VDD.

Figure 7:
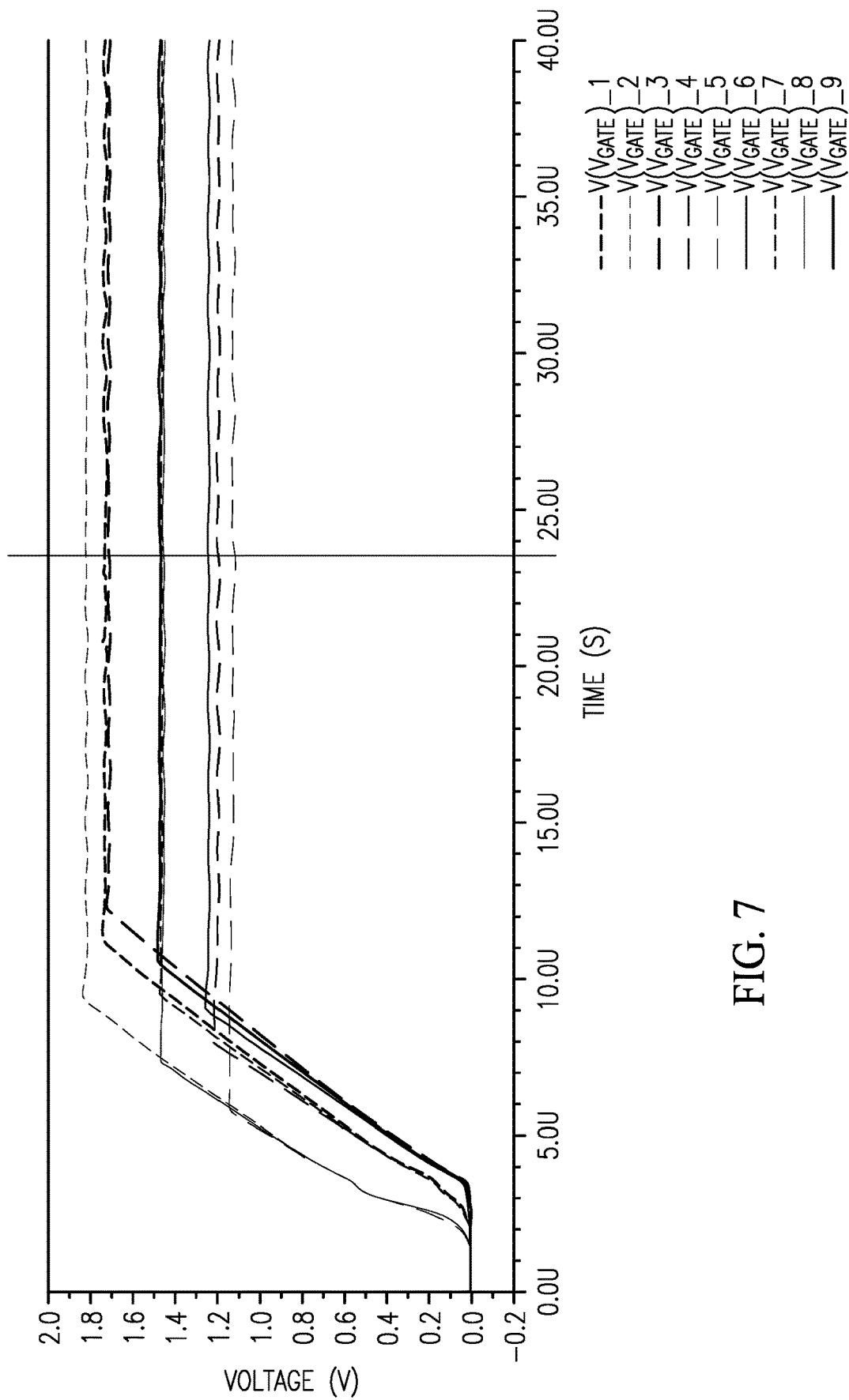
FIG. 7 is a graph of time to voltage for a plurality of gate voltages required in response to process and temperature changes to obtain a fixed current in a memory array of a non-volatile memory.

FIG. 7 shows different gate voltages corresponding to temperature and process changes required to obtain a fixed current in a memory array. The different gate voltages shown in the graph are achieved using the proposed solution, few embodiments of which are shown in FIGS. 3, 4 and 8.

Figure 8:
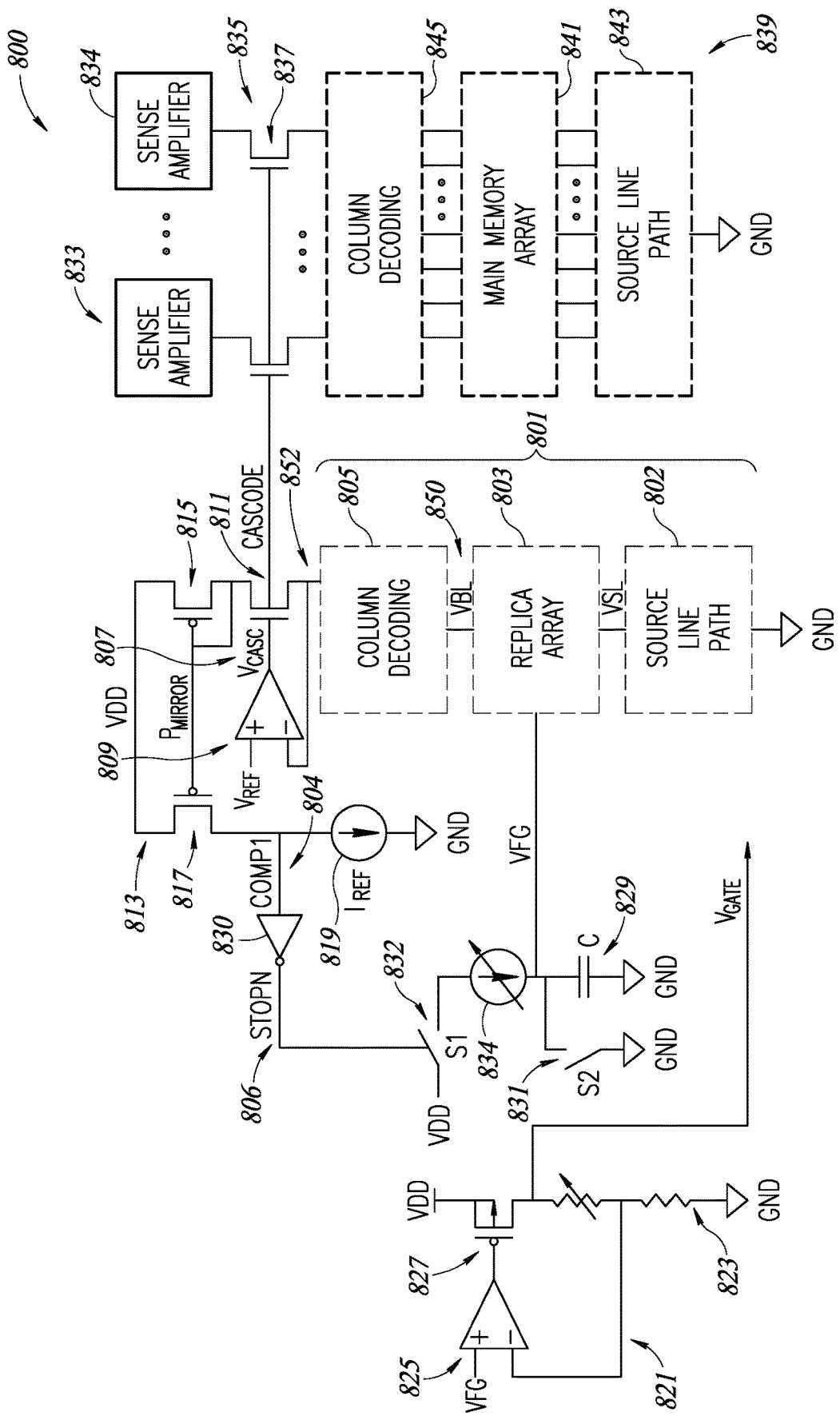
FIG. 8 is another embodiment of a circuit, without an oscillator, that generates word-line voltages for different read and verify operations, and bit-line voltages to avoid read disturb phenomenon, in a non-volatile memory.

FIG. 8 is an embodiment of a non-volatile memory (NVM) circuit 800 that generates temperature and process compensated word-line voltages for memory read, erase verify and program verify operations and generates temperature and process compensated bit-line voltages to avoid read disturb in accordance with the present disclosure. This embodiment may be utilized when high supply voltage VDD is available. Availability of the high supply voltage VDD allows the circuit to operate without a charge pump to increase the voltage levels for wordline and bitline voltages.

The circuit 800 includes a main memory array circuit 839 coupled to a bias replica circuit 801 to generate stable wordline and bitline voltages for a reliable read operation of the NVM. The main memory array circuit 839 includes a main memory array 841, coupled to a source line path block 843 that is coupled to ground. The main memory array 841 is coupled to a column decoding block 845 that is coupled to a plurality of sense amplifiers 833. A plurality of cascode transistors 835 is between the plurality of sense amplifiers 833 and the column decoding block 845 in the FIG. 8. In some embodiments, the cascode transistors 835 are within the sense amplifiers 833.

The bias replica circuit 801 includes a replica source line path block 802 coupled to ground and a replica memory array block 803, which in turn is coupled to a replica column decoding block 805. The bias replica circuit 801 is a representation of the main memory array circuit 839 components, including the column decoding block 845, the main memory array 841, and the source line path block 843. This bias replica circuit 801 is formed at the same time during chip manufacturing as the main memory array circuit 839 such that the components of the bias replica circuit will have the same or similar physical features and will have very similar performance to the main memory array. This allows the bias replica circuit 801 to minimize voltage fluctuations caused by different temperature and process variations during use.

The bias replica circuit is coupled to a cascode voltage generation circuit 807 that is coupled to the main memory array circuit 839 through the cascode transistors 835. The cascode voltage generation circuit 807 includes an operational amplifier 809 coupled to a transistor 811 in a feedback arrangement. An output of the operational amplifier 809 is coupled to gate of the transistor 811. A source terminal of the transistor 811 is coupled to a negative input of the operational amplifier 809. A positive terminal of the operational amplifier 809 is coupled to a voltage supply, the reference voltage, Vref. In some embodiments, the transistor 811 may be an N-MOS transistor.

The cascode voltage generation circuit 807 is coupled to a current mirror 813 having two transistors 815 and 817, which may be P-MOS transistors. The transistors 815, 817 have their gates shorted and coupled to a terminal of the transistor 815 which in turn is coupled to the terminal of the transistor 811 of the cascode voltage generation circuit 807.

A terminal of the current mirror transistor 817 of the current mirror 813 is coupled to a current source 819, which uses a reference current $I_{REF}$ which is the same as the reference current applied to every sense amplifier 834 of the plurality of sense amplifiers 833. The terminal of the current mirror transistor 817 is also coupled to an inverter 830, which is coupled to a switch S1 832. The switch 832 is coupled to the supply voltage VDD when enabled. The switch 832 is also coupled to a capacitor 829 through a current source 834. A switch S2, 831 is coupled to ground and the replica array 803, when enabled. One terminal of the capacitor 829 is coupled to ground and the other terminal is coupled to an operational amplifier based feedback circuit 821 through $V_{FG}$. The operational amplifier feedback circuit 821 includes an operational amplifier 825, the output of which is coupled to the gate of a transistor 827. A terminal of the transistor 827 is coupled to the supply voltage VDD and another terminal is coupled to a resistor ladder 823.

When the NVM circuit is in a non-active state and the VDD is not available, the switch S2, 831 is enabled and the switch S1, 832 is disabled. The floating gate voltage, VFG is clamped to ground through the switch S2. When the NVM circuit is activated and the power supply VDD is settled or otherwise not fluctuating, the switch S2 is turned off and the switch S1 is turned on. With VFG at ground, there is no current flowing through the replica memory array and a node COMP1 is low. This pulls up another node STOPN to the supply voltage VDD, thus enabling the switch S1. As the switch S1 is enabled, the capacitor C, 829 begins charging with a fixed current. Then the voltage VFG starts rising and the current in the replica memory array also starts increasing. Once the current from the replica memory array increases and becomes equal to the current $I_{REF}$, a state of the node COMP1 changes from low to high.

As COMP1 goes high and STOPN goes low, the switch S1 is turned off to stop the charging of the capacitor C. As a result, VFG also stops increasing. VFG settles at a value such that the current from the replica memory array is equal to the $I_{REF}$ current. VFG is also converted to $V_{GATE}$ through the feedback circuit 821 as VFG is input into the operational amplifier 825. This feedback loop generates a stable voltage for the main memory array.

A transconductance of the cascode transistor 811, the memory cells of the replica memory array 803, and the memory cells of main memory array 841 may change with process and temperature, which may change the current flowing in the bias replica circuit 801 and the main memory circuit 839. This change in current changes bitline voltage VBL at nodes 850 and 852 of the bias replica circuit 801. A change in the bitline voltage VBL at node 852 changes the cascode voltage output of the operational amplifier 809 such that the current flowing in the bias replica circuit changes to maintain the earlier level of bitline voltage, which existed before the process and temperature change impact. Since the cascode voltage output of the operational amplifier 809 is also coupled to the plurality of cascode transistors 835 of plurality of sense amplifiers 833 in the main memory circuit, the bitline voltages in the main memory circuit are protected from process and temperature variations in the same way as the bitline voltages of replica memory array.

As the temperature and process changes vary the current flowing in the main memory array circuit 839, the same current variation is mimicked by the current flowing in the bias replica circuit 801 as the cells of main memory array and replica memory array were formed in the same manufacturing processes and have similar responses to process and temperature variations. By changing voltages $V_{GATE}$ and Vfg, the circuit operation ensures that the current in the bias replica circuit 801 and the main memory array circuit 839 remain stable despite any temperature and process changes.

Embodiment of the present disclosure also includes a non-volatile memory circuit that includes a main memory array having a plurality of sense amplifiers coupled to the main memory array. A bias replica circuit is coupled to the main memory array. A cascode voltage generation circuit is coupled to the plurality of sense amplifiers and to the bias replica circuit. The non-volatile memory circuit also includes a current mirror; a current comparator coupled to the current mirror; an oscillator coupled to the current comparator; a phase generator coupled to the oscillator; and a charge pump coupled to the phase generator and the bias replica circuit.

The non-volatile memory circuit includes a resistor divider coupled to the charge pump, the bias replica circuit and the main memory array. The bias replica circuit includes: a replica memory array; a replica column decoding block coupled to the replica memory array; a source line path block coupled to the replica memory array and ground.

The bias replica circuit is configured to maintain a stable bitline voltage and a stable current across process and temperature variations in the main memory array, the current comparator is configured to compare a current from the bias replica circuit with a reference current, the oscillator is configured to generate a clock based on a signal from the current comparator, the phase generator is configured to generate a plurality of clock phases based on the clock, and the charge pump is configured to maintain an output voltage in response to the plurality of clock phases being generated. The cascode voltage generation circuit includes an operational amplifier coupled to the bias replica circuit and a transistor coupled to the operational amplifier and the plurality of sense amplifiers.

The operational amplifier includes a first input coupled to a reference voltage and a second input coupled to the bias replica circuit, and an output is coupled to a gate of the transistor. A first terminal of the transistor is coupled to the second input of the operational amplifier and a second terminal of the transistor is coupled to the current mirror. The current mirror includes a first transistor coupled between the second terminal of the transistor of the cascode voltage generation circuit and a supply voltage and a second transistor coupled between the supply voltage and the current comparator, a gate of the first transistor is coupled to a gate of the second transistor. The current mirror also includes a pair of transistors coupled to the cascode voltage generation circuit, a supply voltage, and the current comparator.

The replica memory array includes a plurality of replica memory cells coupled in a series-parallel configuration. The replica memory array can also include a plurality of active and inactive memory cells such that the active memory cells are coupled in parallel. The oscillator can be a resistor-capacitor oscillator or a voltage controlled oscillator or any type of oscillator which can provide stable clock frequency.

An embodiment of the present disclosure also includes a method of generating read voltages in a non-volatile memory circuit having a main memory array by reading a stable current from a plurality of main memory cells in the main memory array, the reading including providing a wordline voltage to the plurality of main memory cells, the providing including multiplying a supply voltage using a charge pump, providing a floating gate voltage, using a resistor ladder, to a plurality of replica memory cells in a bias replica circuit; and generating a stable bitline voltage from a cascode voltage generation circuit coupled to the bias replica circuit.

The method of generating the stable bitline voltage includes generating a cascode voltage in the cascode voltage generation circuit, activating a transistor, coupling a feedback voltage from the transistor to an operational amplifier, and comparing the feedback voltage with a reference voltage in the operational amplifier.

The method of generating the stable bitline voltage further includes transmitting the stable bitline voltage to a plurality of sense amplifiers in the main memory array, and comparing a current from the bias replica circuit with a reference current in a current comparator that is coupled to the cascode voltage generation circuit. The method further includes mirroring the current from the bias replica circuit in a current mirror where the current mirror is coupled to the current comparator. The method further includes generating a clock based on a signal from the current comparator in an oscillator, generating a plurality of clock phases in a phase generator in response to the clock from the oscillator, and maintaining an output voltage in the charge pump in response to the plurality of clock phases.

An embodiment of the present disclosure also includes a method of generating read voltages in a non-volatile memory having a main memory array by generating a stable bitline voltage from a cascode voltage generation circuit coupled to a bias replica circuit, the generating the stable bitline includes generating a cascode voltage in the cascode voltage generation circuit, activating a transistor, coupling a feedback voltage from the transistor to an operational amplifier, and comparing the feedback voltage with a reference voltage in the operational amplifier.

The method of generating the read voltages includes reading a stable current from a plurality of main memory cells in the main memory array, the reading includes providing a wordline voltage to the plurality of main memory cells, the providing includes multiplying a supply voltage using a charge pump, providing a floating gate voltage, using a resistor ladder to a plurality of replica memory cells in a bias replica circuit. The method further includes transmitting the cascode voltage to a plurality of sense amplifiers in the main memory array and increasing or decreasing the cascode voltage in response to a current through the transistor.

An embodiment of the present disclosure also includes a non-volatile memory circuit that includes a main memory array including a plurality of sense amplifiers coupled to the main memory array, a bias replica circuit coupled to the main memory array, a cascode voltage generation circuit coupled to the plurality of sense amplifiers and to the bias replica circuit, a current mirror, a current comparator coupled to the current mirror. A capacitor is coupled to the current comparator and the bias replica circuit and a feedback circuit coupled to the capacitor and the main memory array. The bias replica circuit further includes a replica memory array, a replica column decoding block coupled to the replica memory array, and a source line path block coupled between the replica memory array and ground.

The cascode voltage generation circuit includes an operational amplifier coupled to the bias replica circuit and a transistor coupled to the operational amplifier and the plurality of sense amplifiers. The operational amplifier includes a first input coupled to a reference voltage and a second input coupled to the bias replica circuit, and an output coupled to a gate of the transistor wherein a first terminal of the transistor is coupled to the second input of the operational amplifier and a second terminal of the transistor is coupled to the current mirror. The current mirror includes a first transistor coupled between the second terminal of the transistor of the cascode voltage generation circuit and a supply voltage, a second transistor coupled between the supply voltage and a current source, a gate of the first transistor coupled to a gate of the second transistor. The current mirror includes a pair of transistors coupled to the cascode voltage generation circuit, a supply voltage, and the current source.

The bias replica circuit is configured to maintain a stable bitline voltage and a stable current across process and temperature variation in the main memory array, the current comparator is configured to compare a current from the bias replica circuit with a reference current, the capacitor is coupled to the replica memory array, the capacitor is configured to maintain a floating gate voltage in response to a signal from the current comparator, and the feedback circuit is configured to maintain an output voltage in response to the floating gate voltage.

The feedback circuit includes a resistor divider, a transistor coupled to the supply voltage, and an operational amplifier with a first input coupled to the floating gate voltage, a second input coupled to the resistor divider and an output coupled to the transistor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-volatile memory circuit, comprising:
   a main memory array;
   a plurality of sense amplifiers coupled to the main memory array;
   a bias replica circuit coupled to the main memory array;
   a cascode voltage generation circuit coupled to the plurality of sense amplifiers and to the bias replica circuit;
   a current mirror;
   a current comparator;
   an oscillator coupled to the current comparator;
   a phase generator coupled to the oscillator; and
   a charge pump coupled to the phase generator and the bias replica circuit.

2. The non-volatile memory circuit of claim 1, further comprising a resistor divider coupled to the charge pump, the bias replica circuit and the main memory array.

3. The non-volatile memory circuit of claim 2 wherein the bias replica circuit includes:
   a replica memory array;
   a replica column decoding block coupled to the replica memory array; and
   a source line path block coupled to the replica memory array and ground.

4. The non-volatile memory circuit of claim 3 wherein:
   the bias replica circuit is configured to maintain a stable bitline voltage and a stable current across process and temperature variation in the main memory array;
   the current comparator is configured to compare a current from the bias replica circuit with a reference current;
   the oscillator is configured to generate a clock based on a signal from the current comparator;
   the phase generator is configured to generate a plurality of clock phases based on the clock; and
   the charge pump is coupled to the replica memory array, the charge pump is configured to maintain an output voltage in response to the plurality of clock phases being generated.

5. The non-volatile memory circuit of claim 2 wherein the cascode voltage generation circuit includes:
   an operational amplifier coupled to the bias replica circuit; and
   a transistor coupled to the operational amplifier and the plurality of sense amplifiers.

6. The non-volatile memory circuit of claim 5 wherein the operational amplifier includes a first input coupled to a reference voltage and a second input coupled to the bias replica circuit, and an output is coupled to a gate of the transistor;
   a first terminal of the transistor is coupled to the second input of the operational amplifier and a second terminal of the transistor is coupled to the current mirror, wherein the current mirror includes:
   a first transistor coupled between the second terminal of the transistor of the cascode voltage generation circuit and a supply voltage; and
   a second transistor coupled between the supply voltage and the oscillator, a gate of the first transistor coupled to a gate of the second transistor.

7. The non-volatile memory circuit of claim 2 wherein the current mirror includes a pair of transistors coupled to the cascode voltage generation circuit, a supply voltage, and the oscillator.

8. The non-volatile memory circuit of claim 3 wherein the replica memory array includes a plurality of replica memory cells coupled in a series-parallel configuration.

9. The non-volatile memory circuit of claim 3 wherein the replica memory array includes a plurality of active and inactive memory cells, the active memory cells are coupled in parallel.

10. A non-volatile memory circuit, comprising:
a main memory array;
a plurality of sense amplifiers coupled to the main memory array;
a bias replica circuit coupled to the main memory array;
a cascode voltage generation circuit coupled to the plurality of sense amplifiers and to the bias replica circuit;
a current mirror;
a current comparator;
a capacitor coupled to the current comparator and the bias replica circuit; and
a feedback circuit coupled to the capacitor and the main memory array.

11. The non-volatile memory circuit of claim 10, wherein the bias replica circuit includes:
a replica memory array;
a replica column decoding block coupled to the replica memory array; and
a source line path block coupled between the replica memory array and ground.

12. The non-volatile memory circuit of claim 10, wherein the cascode voltage generation circuit includes:
an operational amplifier coupled to the bias replica circuit; and
a transistor coupled to the operational amplifier and the plurality of sense amplifiers, wherein the operational amplifier includes a first input coupled to a reference voltage and a second input coupled to the bias replica circuit, and an output coupled to a gate of the transistor.

13. The non-volatile memory circuit of claim 12, wherein a first terminal of the transistor is coupled to the second input of the operational amplifier and a second terminal of the transistor is coupled to the current mirror; and
a current source coupled to the current mirror, wherein the current mirror includes:
a first transistor coupled between the second terminal of the transistor of the cascode voltage generation circuit and a supply voltage; and
a second transistor coupled between the supply voltage and the current source, a gate of the first transistor coupled to a gate of the second transistor.

14. The non-volatile memory circuit of claim 10, wherein the current mirror includes a pair of transistors coupled to the cascode voltage generation circuit, a supply voltage, and the current comparator.

15. The non-volatile memory circuit of claim 10 wherein:
the bias replica circuit is configured to maintain a stable bitline voltage and a stable current across process and temperature variation in the main memory array;
the current comparator is configured to compare a current from the bias replica circuit with a reference current;
the capacitor is coupled to the replica memory array, the capacitor is configured to maintain a floating gate voltage in response to a signal from the current comparator; and
the feedback circuit is configured to maintain an output voltage in response to the floating gate voltage, wherein the feedback circuit includes:
a resistor divider;
a transistor coupled to a supply voltage; and
an operational amplifier with a first input coupled to the floating gate voltage, a second input coupled to the resistor divider and an output coupled to the transistor.

16. A system, comprising:
a main memory array;
a column decoder coupled to the main memory array;
a sense amplifier coupled to the column decoder;
a cascode transistor coupled to the sense amplifier and the column decoder;
a bias replica circuit coupled to the cascode transistor, the bias replica circuit including:
a replica column decoding block; and
a replica array block; and
a feedback circuit coupled to the cascode transistor and the replica array block, the feedback circuit including:
a current mirror coupled to the cascode transistor;
an operational amplifier configured in feedback mode coupled to a gate terminal of the cascode transistor and the current mirror, a positive input coupled to a reference voltage, and a negative input coupled to the replica column decoding block;
a voltage divider coupled to the current mirror, the voltage divider having a first output coupled to a plurality of gate terminals of the main memory array and a second output coupled to the replica array, the second output having a fraction of a voltage at the first output.

17. A system, comprising:
a non-volatile memory circuit; and
a bias generating circuit configured to bias the non-volatile memory circuit, including:
a replica column decoding block;
a replica array block;
a feedback circuit coupled to the column decoding block and the replica array block; and
a cascode transistor coupled to the feedback circuit, wherein a gate terminal of the cascode transistor is coupled to gate terminals of a plurality of transistors of the non-volatile memory circuit, wherein the feedback circuit includes:
a current mirror coupled to the cascode transistor;
an operational amplifier configured in feedback mode coupled to the gate terminal of the cascode transistor and the current mirror, a positive input coupled to a reference voltage, and a negative input coupled to the replica column decoding block; and
a voltage divider coupled to the current mirror, having a first output coupled to a plurality of gate terminals of the non-volatile memory circuit and a second output coupled to the replica array, the second output having a fraction of a voltage at the first output.

18. The system of claim 17, wherein the feedback circuit further includes:
an oscillator generating a clock signal;
an inverter having an input coupled to the current mirror and an output;
an AND gate having a first input coupled to the output of the inverter, a second input coupled to the clock signal, and an output;
a phase generator coupled to the output of the AND gate; and
a capacitor pump coupled to the phase generator and the voltage divider.

19. The system of claim 18, wherein the voltage divider is coupled to the replica array through a replica current mirror having two transistors.

\* \* \* \* \*